United States Patent
Han et al.

(10) Patent No.: US 6,548,416 B2
(45) Date of Patent: Apr. 15, 2003

(54) PLASMA ASHING PROCESS

(75) Inventors: Qingyuan Han, Columbia, MD (US); Ivan Berry, Ellicott City, MD (US); Palani Sakthivel, Gaithersburg, MD (US); Carlo Waldfried, Falls Church, VA (US)

(73) Assignee: Axcelis Technolgoies, Inc., Beverly, MA (US)

( * ) Notice: Subject to any disclaimer, the term of this patent is extended or adjusted under 35 U.S.C. 154(b) by 0 days.

(21) Appl. No.: 09/911,682

(22) Filed: Jul. 24, 2001

(65) Prior Publication Data

US 2003/0022511 A1 Jan. 30, 2003

(51) Int. Cl.$^7$ .............................................. H01L 21/302
(52) U.S. Cl. ........................................ 438/710; 156/345
(58) Field of Search ...................... 438/710; 156/346, 156/345; 216/68; 118/723

(56) References Cited

U.S. PATENT DOCUMENTS

| | | | |
|---|---|---|---|
| 4,341,592 A | 7/1982 | Shortes et al. ............... | 156/643 |
| 5,498,308 A | 3/1996 | Kamarehi et al. .......... | 156/345 |
| 5,571,439 A | 11/1996 | Daley et al. ................. | 219/716 |
| 5,811,022 A * | 9/1998 | Savas et al. .................. | 216/68 |
| 5,961,851 A | 10/1999 | Kamarehi et al. ............. | 216/69 |
| 5,980,638 A | 11/1999 | Janos .......................... | 118/715 |
| 6,057,645 A | 5/2000 | Srivastava et al. ....... | 315/111.21 |
| 6,080,529 A * | 6/2000 | Ye et al. ....................... | 430/318 |
| 6,082,374 A | 7/2000 | Huffman et al. ............. | 134/1.1 |
| 6,211,092 B1 * | 4/2001 | Tang et al. .................. | 438/719 |
| 6,225,745 B1 | 5/2001 | Srivastava ............. | 315/111.51 |
| 6,230,651 B1 * | 5/2001 | Ni et al. .................... | 118/723 I |
| 6,331,380 B1 * | 12/2001 | Ye et al. ...................... | 430/318 |
| 6,399,511 B2 * | 6/2002 | Tang et al. .................. | 438/714 |
| 6,458,516 B1 * | 10/2002 | Ye et al. ....................... | 430/317 |

FOREIGN PATENT DOCUMENTS

WO    WO 97/37055    10/1997

* cited by examiner

Primary Examiner—John F. Niebling
Assistant Examiner—Olivia Luk
(74) Attorney, Agent, or Firm—Cantor Colburn LLP

(57) ABSTRACT

A plasma ashing process and apparatus for selectively ashing photoresist and/or post etch residues from a semiconductor substrate includes generating a reduced ion density plasma in a plasma generation region at a pressure of at least 2 torr greater than the processing chamber pressure; and exposing the wafer surface having the photoresist and/or post etch residues thereon to the reduced ion density plasma to selectively remove the photoresist and/or post etch residues from the surface and leave the surface substantially the same as before exposing the substrate to the reduced ion density plasma.

4 Claims, 4 Drawing Sheets

PLASMA ASHING PROCESS

FIELD OF INVENTION

The present invention relates generally to plasma ashing processes for selectively removing photoresist, polymers and residues from semiconductor substrates. More particularly, the process relates to plasma ashing semiconductor substrates including low k dielectric surfaces.

BACKGROUND OF THE INVENTION

Ashing is a plasma mediated stripping process by which photoresist, polymer and/or residues are stripped or removed from a substrate upon exposure to the plasma. Ashing generally occurs after an etching process has been performed in which the photoresist material is used as a photomask for etching a pattern into the substrate. Additionally, the ashing process may be performed for removal of misaligned resist patterns ("rework wafers") and in lift-off processes. The process steps occurring prior to ashing may modify the surface of the photoresist, form polymers and/or form residues. It is highly desirable when ashing that complete removal of the photoresist, polymer and/or residues occur as quickly as possible without loss or modification of any of the materials comprising the substrate. Minimizing the loss or modification is a constant challenge.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high energy ion bombardment at low temperatures to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. Transferring a permanent image into the underlying substrate is not the purpose of this step. Accordingly, the ashing plasma chemistry is much less aggressive than etching chemistries and generally is chosen to remove the photoresist mask layer at a rate much greater than the removal rate of the underlying substrate. It is desirable to generate low energy ions in the plasma for removing the photoresist, polymers and/or residues without causing damage to the substrate. Moreover, most ashing processes heat the substrate to temperatures greater than 200° C. to increase the plasma reactivity. Thus, etching and ashing processes are directed to removal of significantly different materials and as such, require completely different plasma constituents, chemistries and processes. Successful ashing processes are defined by the photoresist, polymer and residue removal rates without affecting or removing layers comprising the underlying substrate.

Ashing selectivity is defined as the relative removal rate of the photoresist compared to the underlying layer. It is preferred to have an ashing selectivity of at least 50:1, wherein the photoresist is removed at least 50 times faster than the underlying substrate. More preferably, the ashing selectivity is much greater than 100:1.

During plasma ashing processes, it is important to maintain a critical dimension (CD) for the various features within a tightly controlled specification as well as promote proper underlayer surface conditions for successful metal filling in the process steps occurring after photoresist, polymer, and residue removal. Small deviations in the patterned profiles formed in the underlayers can adversely impact device performance, yield and reliability of the final integrated circuit. Traditionally, the ashing plasma has been generated from oxygen-containing gases. However, it has been found that oxygen-containing plasmas readily damage certain materials used in advanced integrated circuit manufacture. For example, oxygen-containing plasmas are known to raise the dielectric constant of low k dielectric underlayers during plasma processing. The increases in dielectric constant affects, among others, interconnect capacitance, which directly impacts device performance. Moreover, the use of oxygen-containing plasmas is generally less preferred for advanced device fabrication employing copper metal layers.

In order to overcome some of these problems, oxygen-free plasma chemistries have been developed. Oxygen-free plasmas can be used to effectively remove photoresist, polymers and residues from substrates containing low k dielectric materials without causing significant physical damage to the low k dielectric layer. Oxygen-free plasmas are typically generated from a hydrogen and nitrogen gas mixture that may further contain fluorine gases. However, in some cases it has been found that the use of oxygen-free plasmas containing nitrogen may alter and/or affect the chemical, mechanical and electrical properties of underlying substrate.

Accordingly, it is highly desirable to have an ashing process that completely and rapidly removes the photoresist, polymer and residues without affecting or removing the underlying surface materials, including low k dielectric surfaces.

SUMMARY OF THE INVENTION

A plasma ashing process and apparatus for selectively removing photoresist and/or post etch residues from a semiconductor substrate is described. In one embodiment, the ashing process includes placing a wafer into a processing chamber, wherein the wafer comprises a surface having the photoresist and/or post etch residues thereon; generating a reduced ion density plasma in a plasma generation region at a pressure of at least 2 torr greater than the processing chamber pressure; and exposing the wafer surface having the photoresist and/or post etch residues thereon to the reduced ion density plasma to selectively remove the photoresist and/or post etch residues from the surface and leave the surface substantially the same as before exposing the substrate to the reduced ion density plasma.

In another embodiment, a process for reducing ion density in a downstream plasma asher includes flowing a gas mixture into a plasma-generating region at a predetermined pressure; and exposing the gas mixture to an energy source sufficient to form a plasma in the plasma generating region at the predetermined pressure, wherein the predetermined pressure is selected to reduce the ion density in the plasma. The process may further include discharging the reduced ion density plasma into a processing chamber, wherein the predetermined pressure is selected to create a pressure differential greater than 2 torr between the plasma generating region and processing chamber, the pressure being greater in the plasma generating region. The process may further include exposing a surface having a photoresist and/or post etch residues thereon to the plasma to selectively remove the photoresist and /or post etch residues from the surface, wherein the surface comprises a low k dielectric material and is substantially the same as before exposing the surface to the reduced ion density plasma. Preferably, the predetermined pressure in the plasma-generating region ranges in an amount from greater than 2 torr to atmospheric pressure.

A downstream plasma asher apparatus includes a processing chamber; a plasma generating region comprising a gas inlet, a plasma tube coupled to the gas inlet and a discharge opening; a conduit in communication with the processing chamber and the discharge opening of the plasma generating region for discharging a plasma formed in the region into the processing chamber; and an orifice disposed in the conduit, wherein the orifice narrows an opening of the conduit to create a pressure differential greater than 2 torr between the plasma tube and the processing chamber, wherein the pressure is greater in the plasma tube. In one embodiment, the downstream plasma asher includes a microwave energy source in communication with the plasma generating region for exciting a gas mixture to form a reduced ion density plasma. In another embodiment, the downstream plasma asher includes a radio frequency energy source in communication with the plasma generating region for exciting a gas mixture to form a reduced ion density plasma. Preferably, the orifice comprises a variable aperture for adjusting the pressure in the plasma-generating region.

DETAILED DESCRIPTION OF THE INVENTION

Figure 1:
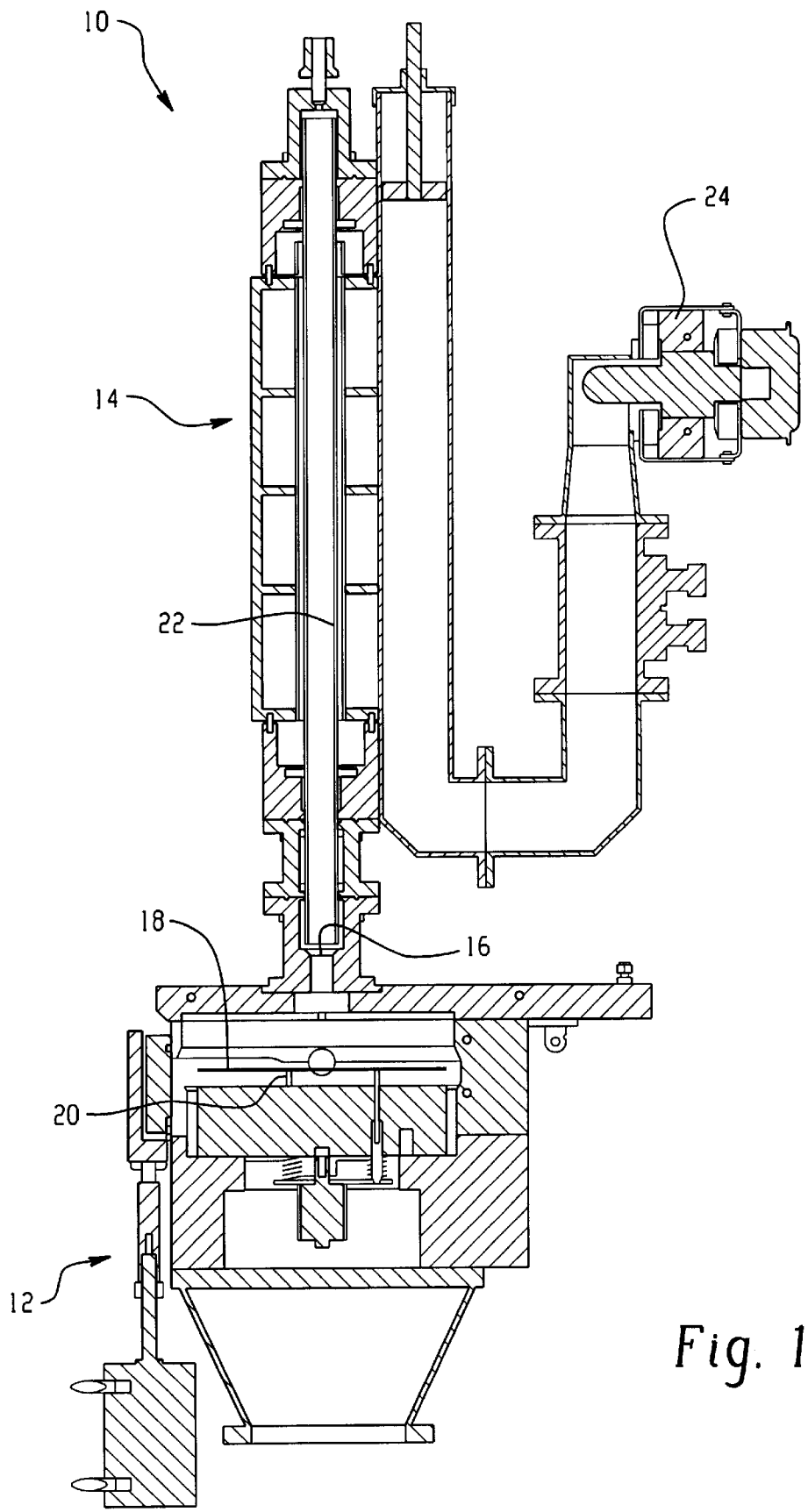
FIG. 1 is a cross section of a microwave downstream plasma asher.

An improved plasma ashing process for efficiently removing photoresist and etch residues from a semiconductor substrate is described. It has been found that reducing plasma ion density at the substrate surface results in a more robust process for removing photoresist and post etch residues without causing damage to the underlying substrate. Advantageously, the plasma ashing process can be practiced on semiconductor substrates including, but not limited to, substrates having low k dielectric surfaces without damaging the low k material. In a preferred embodiment, increasing the pressure within a plasma-generating region reduces the plasma ion density delivered to the substrate surface. To increase the pressure in the plasma-generating region, a narrow orifice or orifices are preferably installed in an opening between the plasma-generating region and a substrate-processing chamber. Preferably, the plasma-generating region pressure creates a pressure differential greater than about 2 torr between the region and the processing chamber.

The process can be practiced in plasma ashers that include a plasma source and a processing chamber. The invention is not intended to be limited to any particular plasma asher. Plasma asher devices particularly suitable for practicing the present invention are downstream plasma ashers, such as for example, those microwave plasma ashers available under the trade name Fusion GEMINI ES® and commercially available from Axcelis Technologies, Inc. in Rockville, Md. Portions of the microwave plasma asher are described in U.S. Pat. Nos. 5,571,439, 5,498,308, 6,082,374, 5,980,638, 5,961,851, 6,057,645, 6,225,745 and 4,341,592, and PCT International Application No. WO/97/37055, all of which are incorporated herein by reference in their entireties. Other examples of plasma generating and discharge devices that may be utilized according to the present invention include ashers employing radio frequency (RF) energy to generate the plasma. The settings and optimization for particular plasma ashers and gas chemistries will be well within the skill of those in the art in view of this disclosure.

During operation of the plasma asher device, a single or multi-component gas mixture flows into a plasma-generating region, wherein the gas is exposed to an energy source to generate a plasma. The plasma is then discharged from the plasma-generating region through an opening or openings into the processing chamber. The pressure within the processing chamber is preferably reduced to optimize residence time for highest reaction rate on the substrate. Under normal operation conditions, a pressure differential exists between the plasma-generating region and processing chamber as a function of the gas flow into the plasma-generating region, e.g., plasma tube, the opening between the region and chamber, and the chamber. Typically, the pressure differential is about 1 torr, wherein the pressure within the plasma-generating region is greater than the pressure within the process chamber. This relationship can be described mathematically as shown in equation (1).

$$Pt=F/C+Pc \qquad (1)$$

wherein Pt represents the pressure within the plasma tube, F is the gas flow, C is the conductance of the opening between the plasma tube and the process chamber, and Pc is the pressure within the process chamber.

The present invention is directed to increasing the pressure within the plasma-generating region to reduce the ion density content of the plasma generated. The pressure within the plasma-generating region preferably ranges from about 2 torr to about atmospheric pressure. The atmospheric pressure limit may vary depending on the gas composition and the ability to strike and sustain a plasma. Preferably, the increased pressure within the plasma-generating region creates a pressure differential greater than 2 torr between the region and the substrate processing chamber.

Turning now to the drawings and in particular FIG. 1, a downstream microwave plasma asher device 10 is depicted. The illustrated plasma asher device 10 generally includes a processing chamber 12 and a plasma generating system 14 connected to and in communication with the processing chamber 12 by passageway 16.

The processing chamber 12 encloses a semiconductor substrate 18, i.e., wafer, with photoresist and/or posts etch residues thereon to be ashed. The wafer 18 is supported by a chuck or pins 20 and is preferably heated to accelerate the reaction of the photoresist and/or post etch residues with the plasma. One or more baffle plates (not shown) may be present above the wafer to promote even distribution of the plasma. During use, the pressure within the process chamber 12 is reduced. Preferably, the pressure within the chamber 12 is maintained between about 1 torr to about 7 torr. More preferably, the pressure is maintained from about 1 torr to about 3 torr.

The plasma generating system 14 provides plasma to an interior of the processing chamber 12. A gas box (not shown) controls the flow of gases into the plasma generating system 14. Once inside the plasma generating system 14, the gases are exposed to an excitable energy source. For example, microwave energy can be generated by magnetron 24 to ionize the gases and form plasma in a plasma tube 22. The passageway 16 as shown in this example is hereinafter referred to as the "no orifice" configuration. Operation of the plasma asher normally results in an operating pressure within the plasma tube 22 of about 1 torr greater than the operating pressure within the processing chamber 12.

Figure 2A:
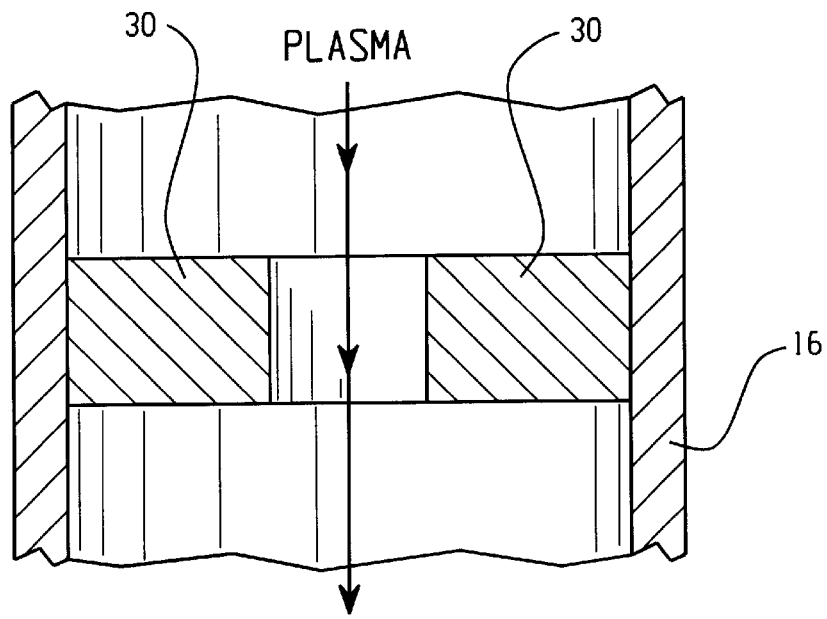
FIG. 2 is a cross section of an orifice installed in a passageway between a plasma-generating region and a processing chamber.
Figure 2B:
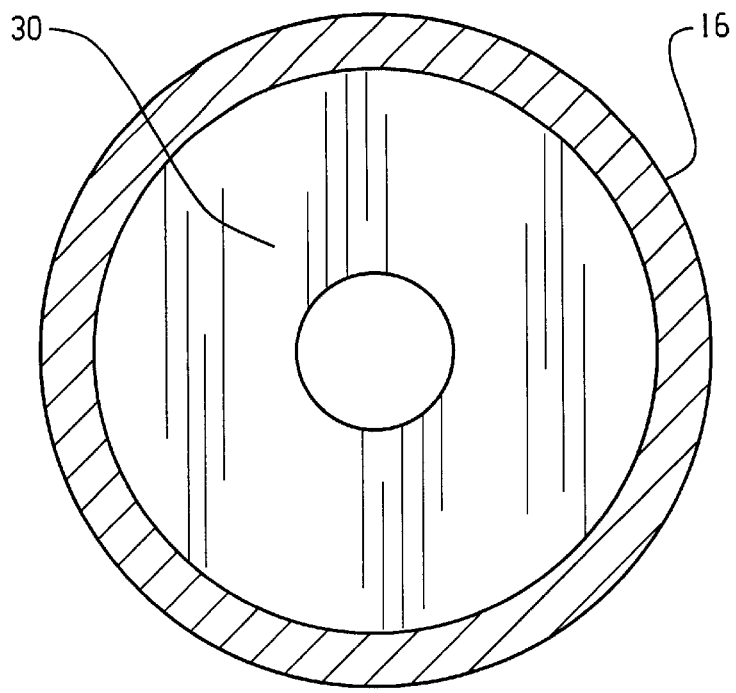

Referring now to FIGS. 2A and 2B, in a preferred embodiment, an orifice 30 is installed in passageway 16 between the plasma-generating region 14 and the processing chamber 12. The orifice 30 is adapted to narrow the opening of passageway 16, thereby increasing the pressure within the plasma tube 22. The orifice 30 is preferably fabricated from a thermally stable and non-reactive material. Preferably, the orifice 30 is fabricated from quartz or aluminum oxide. The orifice 30 decreases the conductance between the plasma tube and the processing chamber and as such, pressure within the tube 22 is increased in proportion to the gas flow rate into the plasma tube. Preferably, the orifice 30 is a variable orifice, wherein an operator may externally control the pressure within plasma tube 22 by adjusting the size of the variable orifice opening. For example, the variable orifice may be comprised of an iris employing rigid shutter elements of the design utilized in cameras. Those skilled in the art will appreciate that the orifice, variable orifice or fixed diameter orifice, can be adapted to any shape, size or configuration to increase the operating pressure within the plasma tube 22.

In a preferred embodiment, the orifice is configured in the passageway 16 to generate a pressure differential of at least 2 torr between the process chamber 12 and the plasma-generating region 14, wherein the pressure within the plasma-generating region is greater than the pressure within the chamber. The pressure generated within the plasma tube 22 preferably ranges from about 2 torr to about atmospheric pressure. The atmospheric pressure limit may vary depending on the gas composition and the ability to strike and sustain a plasma. While not wanting to be bound by theory, it is believed that by increasing the pressure within the plasma-generating region 14, e.g., the plasma tube 22, the ion density is reduced as a function of the reduction in the gas mean free path. The reduction in gas mean free path is believed to increase the likelihood of an ion colliding with a gas molecule or a surface undergoing charge exchange, thereby reducing ion density.

Photoresists are generally organic photosensitive films used for transfer of images to an underlying substrate. The present invention is generally applicable to ashing those photoresists and etch residues thereof used in g-line, i-line, DUV, 193 nm, and 157 nm applications or the like. This includes, but is not limited to, novolaks, polyvinylphenols, acrylates, acetals, polyimides, ketals, cyclic olefins or the like. Other photoresist formulations suitable for use in the present invention will be apparent to those skilled in the art in view of this disclosure. The photoresist may be positive acting or negative acting depending on the photoresist chemistries and developers chosen.

Advanced semiconductor fabrication utilizes insulating layers that typically include the use of low k materials that have dielectric constants less than about 3.0. The process employing a reduced ion density plasma can be utilized without deleteriously damaging or modifying the properties of the low k surface. Important low k film properties include thickness and uniformity, dielectric constant, refractive index, adhesion, chemical resistance, thermal stability, pore size and distribution, coefficient of thermal expansion, glass transition temperature, film stress and copper diffusion coefficient. Low k dielectrics can be generally classified as one of three types: organic, porous and doped oxides. Organic low k dielectric materials include polyimides, benzocyclobutene, parylenes and fluorocarbons. An example of commercially available organic dielectrics are spin-on aromatic hydrocarbons referred to by the trademark SILK® and commercially available from Dow Chemical. SILK® contains no fluorine or silicon and has a reported dielectric constant of 2.6 to 2.8. Examples of porous low k dielectric materials include nanoglass and aerogels. Examples of doped oxide low k dielectric materials include hydrogen-doped oxides, e.g., hydrogen silsesquioxanes (HSQ), fluorine-doped oxides, e.g., fluorinated silicate glass (FSG) and carbon-doped oxides such as those available under the trademark CORAL®. A spin-on HSQ is commercially available from Dow Corning under the trademark FOx®. FOx® is reported to have a dielectric constant of 2.6 to 3.0. Hybrid carbon containing dielectrics are commercially available under the trademark HOSP®. Other examples include xerogels and methyl silsesquioxanes (MSQ). Other low k dielectric materials will be apparent to those skilled in the art in view of this disclosure.

Figure 3:
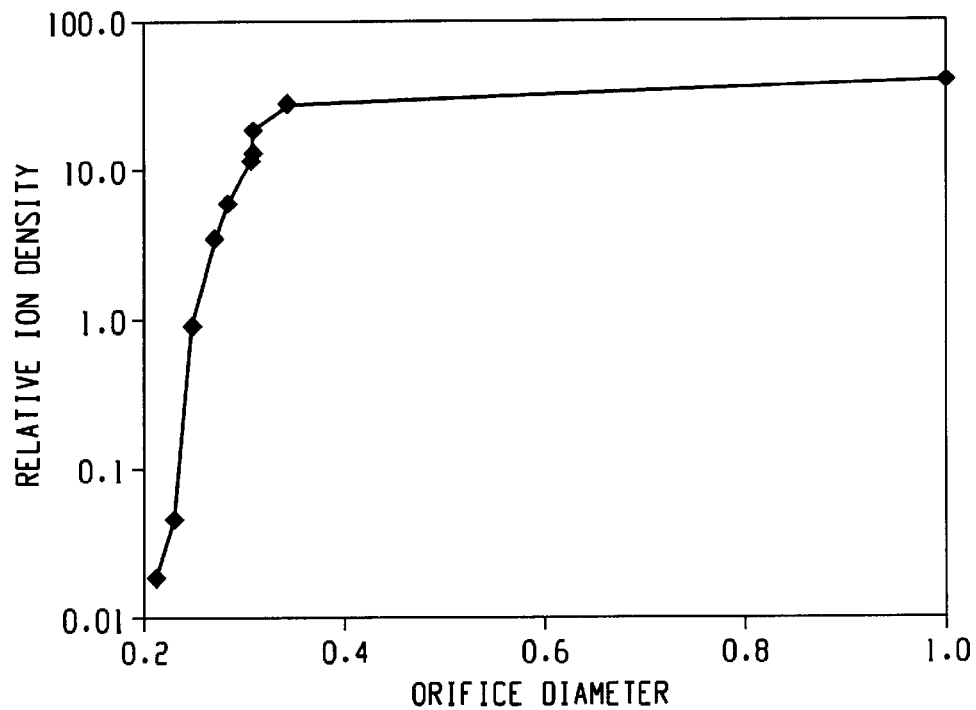
FIG. 3 is a graphical illustration depicting relative ion density at the wafer surface as a function of orifice diameter for an $O_2/(H_2/N_2)/CF_4$ plasma.

FIG. 3 graphically illustrates the relative ion plasma density at the wafer surface as a function of the diameter of the orifice 30. Decreasing the orifice diameter to less than about 0.4 inches increased the backpressure within the plasma tube 22 to an amount effective to significantly reduce the plasma ion density at the wafer surface. In this particular example, plasma was generated from a mixture of oxygen gas, forming gas and a trickle amount of $CF_4$. It is expected that other gas chemistries will produce similar results in response to decreasing the orifice diameter. Accordingly, the process is applicable to oxygen free, oxygen containing, fluorine plasmas and the like, such as those gas chemistries disclosed in pending U.S. patent application Ser. Nos. 09/368,553 and 09/434,617, to Han et al., incorporated herein by reference in their entireties.

Figure 4:
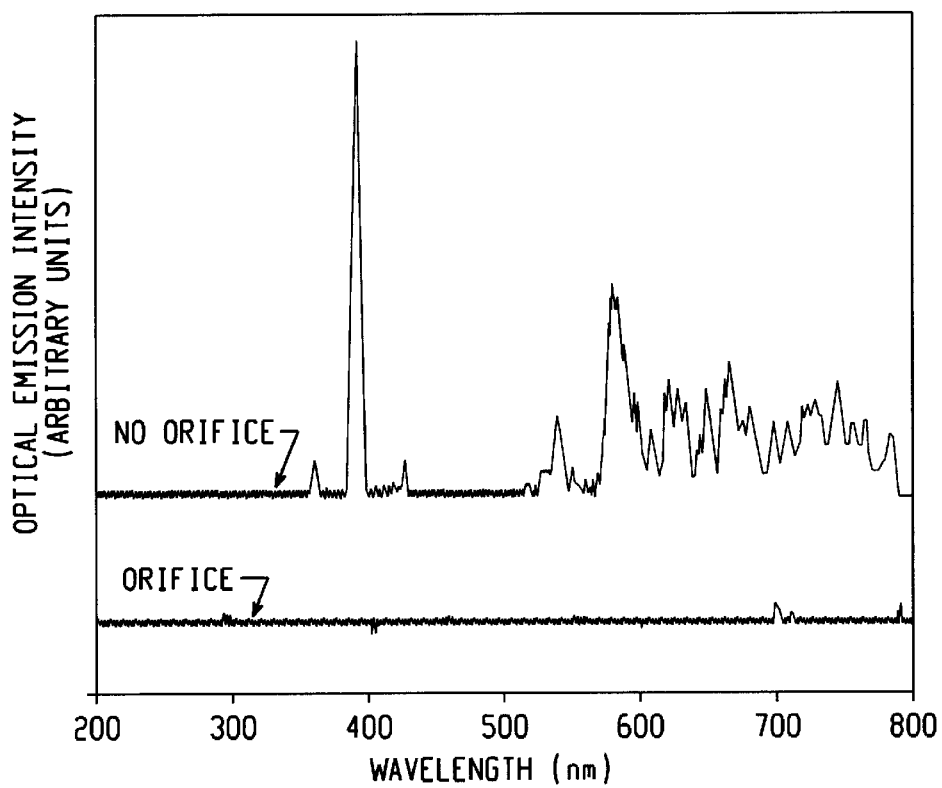
FIG. 4 is a graphical illustration of the optical emission intensity for different pressure conditions as a function of wavelength.

Referring now to FIG. 4, there is shown a graphical representation of the optical emission intensity for reactive species as a function of wavelength generated in oxygen free plasma. The oxygen free plasma is generated from a gas mixture containing a fluorine compound and a forming gas. Forming gas is a gas mixture that consists essentially of hydrogen and nitrogen gases. The use of forming gas in the gas mixture is known by those skilled in the art to generate characteristic CN emission signals. The optical emission intensity was monitored from plasma generated in a plasma asher configured with an orifice 70 installed in passageway 16 and in a plasma asher configured without an orifice, i.e., a "no orifice" configuration. The plasma asher configured with an orifice 30 resulted in a pressure differential between the plasma tube 22 and the process chamber 12 of about 6 torr, which produced weak emission signals at 695 nm, 71 nm and 790 nm. In the "no orifice" configuration, the spectrum shows a sharp emission line at 387 nm and several smaller emission signal peaks in the 500 to 800 nm wavelength range. Thus, the data shows a redistribution of ions and radicals generated within the reduced ion density plasma.

Figure 5:
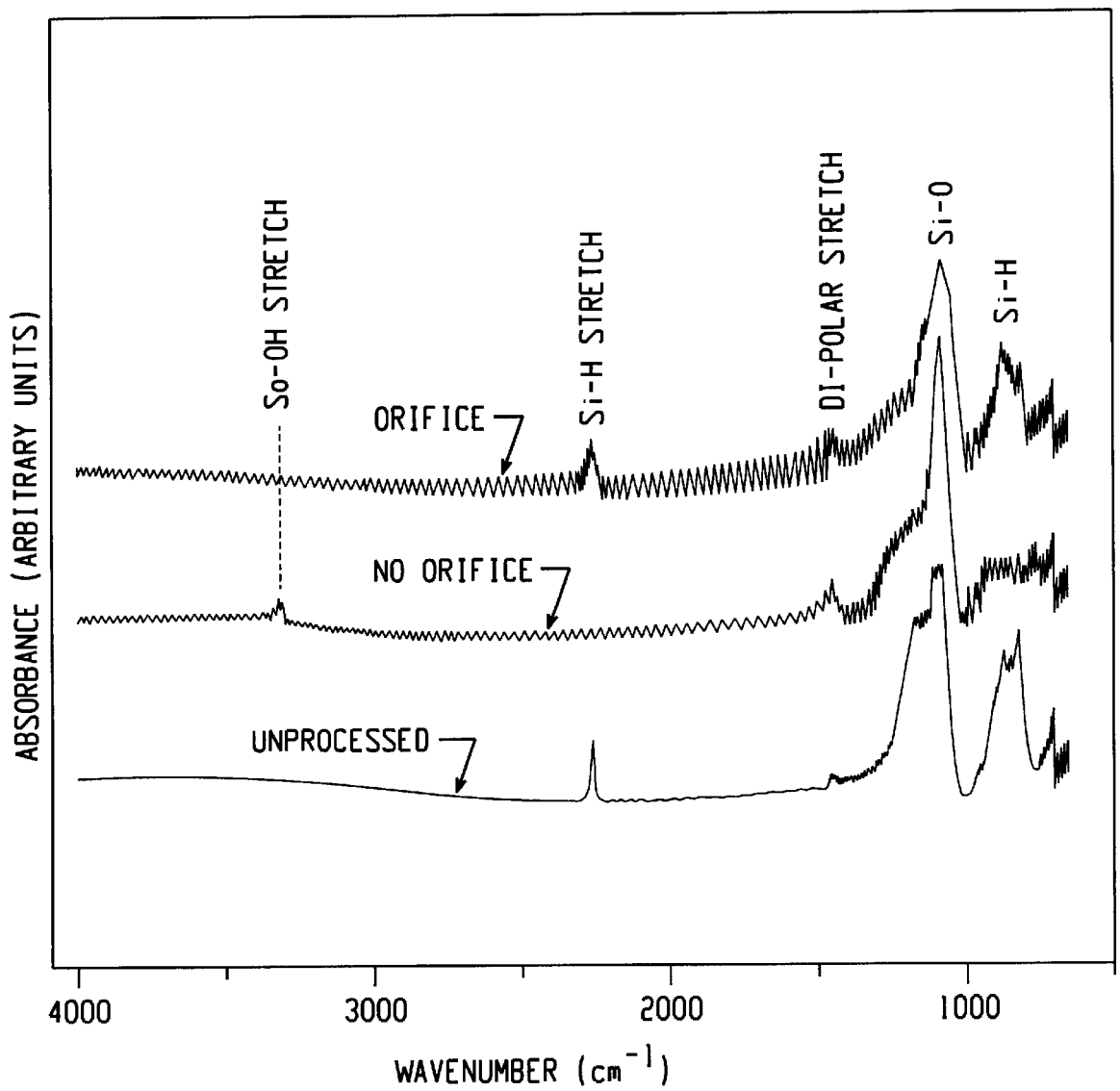
FIG. 5 is a graph depicting a fourier transform infrared analysis (FTIR) of absorbance as a function of wavelength for different operating conditions.

FIG. 5 graphically illustrates a Fourier Transform Infrared Analysis (FTIR) of a low k surface before and after exposure to oxygen free plasma. Exposing the low k surface to plasma generated in a plasma asher without an installed orifice results in a reduction or complete loss of SI—H stretch mode at 2260 cm$^{-1}$ and causes a pronounced intensity increase of a di-polar stretch mode adsorbance at 1430 cm$^{-1}$. Under these conditions, a differential of about 1 torr existed between the processing chamber 12 and the plasma tube 22. In contrast, employing an orifice 30 to increase the backpressure within the plasma tube 22 to create a pressure differential in excess of about 6 torr results in a plasma that does not damage the low k surface. The increased pressure reduced the plasma ion density, and unexpectedly, FTIR analysis of the low k surface shows that the surface did not change as compared to the control, i.e., the unprocessed low k surface.

The foregoing descriptions of the preferred embodiments of the invention have been presented for purposes of illustration and description. It is not intended to be exhaustive or to limit the invention to the precise forms disclosed. Obvious modifications or variations are possible in light of the above teachings. The embodiments were chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A downstream plasma asher comprising:

a processing chamber;

a plasma generating region comprising a gas inlet, a plasma tube coupled to the gas inlet and a discharge opening;

a conduit in communication with the processing chamber and the discharge opening of the plasma generating region for discharging a plasma formed in the region into the processing chamber; and an orifice disposed in the conduit, wherein the orifice narrows an opening of the conduit to create a pressure differential greater than 2 torr between the plasma tube and the processing chamber, wherein the pressure is greater in the plasma tube.

2. The downstream plasma asher according to claim 1 further comprising a microwave energy source in communication with the plasma generating region for exciting a gas mixture to form a reduced ion density plasma.

3. The downstream plasma asher according to claim 1 further comprising a radio frequency energy source in communication with the plasma generating region for exciting a gas mixture to form a reduced ion density plasma.

4. The downstream plasma asher according to claim 1 wherein the orifice comprises a variable aperture for adjusting the pressure in the plasma generating region.

\* \* \* \* \*